(12) United States Patent
Saxler

(10) Patent No.: US 6,841,001 B2
(45) Date of Patent: Jan. 11, 2005

(54) STRAIN COMPENSATED SEMICONDUCTOR STRUCTURES AND METHODS OF FABRICATING STRAIN COMPENSATED SEMICONDUCTOR STRUCTURES

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 123 days.

(21) Appl. No.: 10/199,454

(22) Filed: Jul. 19, 2002

(65) Prior Publication Data

US 2004/0012015 A1 Jan. 22, 2004

(51) Int. Cl.$^7$ ............................................. C30B 25/22
(52) U.S. Cl. ........................... 117/84; 117/89; 117/94; 117/98; 117/105
(58) Field of Search ............................ 117/84, 89, 105, 117/94, 98

(56) References Cited

U.S. PATENT DOCUMENTS

| | | | |
|---|---|---|---|
| 5,192,987 A | 3/1993 | Khan et al. | 257/183.1 |
| 5,296,395 A | 3/1994 | Khan et al. | 437/40 |
| 5,393,993 A | 2/1995 | Edmond et al. | 257/77 |
| 5,592,501 A | 1/1997 | Edmond et al. | 372/45 |
| 5,838,706 A | 11/1998 | Edmond et al. | 372/45 |
| 5,874,747 A | 2/1999 | Redwing et al. | 257/77 |
| 5,877,519 A | 3/1999 | Jewell | 257/190 |
| 6,046,464 A * | 4/2000 | Schetzina | 257/96 |
| 6,064,082 A | 5/2000 | Kawai et al. | 257/192 |
| 6,072,189 A * | 6/2000 | Duggan | 257/14 |
| 6,121,121 A * | 9/2000 | Koide | 438/479 |
| 6,165,874 A * | 12/2000 | Powell et al. | 438/478 |
| 6,177,685 B1 | 1/2001 | Teraguchi et al. | 257/20 |
| 6,194,241 B1 | 2/2001 | Tsutsui et al. | 438/46 |
| 6,194,742 B1 | 2/2001 | Kern et al. | 257/94 |
| 6,316,793 B1 | 11/2001 | Sheppard et al. | 257/103 |
| 6,429,467 B1 | 8/2002 | Ando | 257/194 |
| 6,515,316 B1 | 2/2003 | Wojtowicz | 257/194 |

(List continued on next page.)

FOREIGN PATENT DOCUMENTS

| | | |
|---|---|---|
| WO | WO 02/13245 A1 | 2/2002 |
| WO | WO 02/48434 A2 | 6/2002 |
| WO | WO 03/049193 | 6/2003 |

OTHER PUBLICATIONS

Kim et al., "Effects of step–graded AlGa N interlayer on properties of GaN grown on Si using ultrhigh vacuum chemical vapor deposition", Applied Physics Letters vol. 79, No. 17 Oct. 22, 2001 pp. 2713–2715.*

Marchand et al. "Metalorganic chemical vapor deposition of GaN on Si(111): Stress control and application to field–effect transistors," Journal of Applied Physics vol. 89, No. 12, Jun. 15, 2001, pp. 7846–7851.

Waldrip et al. "Stress engineering during metalorganic chemical vapor deposition of AiGaN/GaN distributed Bragg reflectors," Applied Physics Letters, vol. 78, No. 21, May 21, 2001, pp. 3205–3207.

(List continued on next page.)

Primary Examiner—Robert Kunemund
(74) Attorney, Agent, or Firm—Myers Bigel Sibley & Sajovec, P.A.

(57) ABSTRACT

Semiconductor structure and method of fabricating a semiconductor structure are provided that include a substrate having a first in-plane unstrained lattice constant, a first layer comprising a first semiconductor material on the substrate and having a second in-plane unstrained lattice constant that is different from the first in-plane unstrained lattice constant and a variable mismatch layer comprising a second semiconductor material disposed between the substrate and the first layer. The variable mismatch layer is configured to reduce stress in the first layer to below a level of stress resulting from growth of the first layer directly on the substrate. The variable mismatch layer may be a layer having a strained in-plane lattice constant that substantially matches the unstrained lattice constant of the first layer.

40 Claims, 2 Drawing Sheets

U.S. PATENT DOCUMENTS

| | | |
|---|---|---|
| 2001/0015446 A1 | 8/2001 | Inoue et al. .............. 257/192 |
| 2001/0020700 A1 | 9/2001 | Inoue et al. .................. 257/20 |
| 2001/0023964 A1 | 9/2001 | Wu et al. ................... 257/368 |
| 2002/0020341 A1 * | 2/2002 | MArchand et al. ........... 117/84 |
| 2003/0102482 A1 | 6/2003 | Saxler |

OTHER PUBLICATIONS

Etzkorn et al. "Cracking of GaN films," *Journal of Applied Physics,* vol. 89, No. 2, Jan. 15, 2001, pp. 1025–1034.

Sullivan et al. "High–Power 10–Ghz Operation of AlGaN HFET's on Insulating SiC," *IEEE Electron Device Letters,* vol. 19, No. 6, Jun. 1998, pp. 198–200.

Sheppard et al. "Improved 10–Ghz Operation of GaN/AlGaN HEMTs on Silicon Carbide," *Materials Science Forum,* vols. 338–42 (2000), pp. 1645–1646, No month.

Wu et al. "High Al–Content AlGaN/GaN MODFET's for Ultrahigh Performance," *IEEE Electron Device Letters,* vol. 19, No. 2, Feb. 1998.

Yu et al. "Schottky barrier engineering in III–V nitrides via the piezoelectric effect," *Applied Physics Letters,* vol. 73, No. 13, Sep. 28, 1998, pp. 1880–1882.

International Search Report dated Nov. 17, 2003 for PCT/US03/10788.

Bharatan et al. "Structural characterization of GaN and $GaAs_xN_{1-x}$ grown by electron cyclotron resonance–metalorganic molecular beam epitaxy," *J. Vac. Sci. Technol. A* vol. 12, No. 4, Jul. 1994.

Kim et al. "Effects of step–graded $A1xGa_{1-x}N$ interlayer on properties of GaN grown on Si(111) using ultrahight vacuum chemical vapor deposition," *Applied Physics Letters,* vol. 79, No. 17, Oct. 22, 2001.

Marchand et al. "Metalorganic Chemical Vapor Deposition of GaN on SI(111): Stress Control and Application to Field–Effect Transistors," *Journal of Applied Physics,* vol. 89, No. 12, Jun. 15, 2001.

Molina et al. "Strain relief in linearly graded composition buffer layers: a design scheme to grow dislocation–free ($<10^5$ $cm^{-2}$) and unstrained epilayers," *Applied Physics Letters* vol. 65, No. 19, Nov. 7, 1994.

Tan et al "$N_2O$ oxidation of strained–Si/relaxed–SiGe heterostructure grown by UHVCVD," *Solid State Electronics,* vol. 45 (2001) pp. 1945–1949.

* cited by examiner

STRAIN COMPENSATED SEMICONDUCTOR STRUCTURES AND METHODS OF FABRICATING STRAIN COMPENSATED SEMICONDUCTOR STRUCTURES

FIELD OF THE INVENTION

The present invention relates to semiconductor structures and in particular relates to structures having different unstrained lattice constants for layers of the structures.

BACKGROUND

In the fabrication of semiconductor devices, it is sometimes the case that the devices are fabricated of semiconductor materials that are lattice mismatched with a substrate or underlying layer. For example, GaN is conventionally fabricated on a sapphire substrate or a silicon carbide substrate. The unstrained lattice constant of GaN is 3.19 whereas the unstrained lattice constant of sapphire is 4.76 and silicon carbide is 3.07. As a result, the GaN grown on the substrate may be strained. If such is the case and if the level of strain exceeds a threshold at which GaN cracks, the GaN will crack which may render the GaN unacceptable for use in a semiconductor device.

SUMMARY OF THE INVENTION

Embodiments of the present invention provide semiconductor structures and methods of fabricating semiconductor structures that include a substrate having a first in-plane unstrained lattice constant, a first layer comprising a first semiconductor material on the substrate and having a second in-plane unstrained lattice constant that is different from the first in-plane unstrained lattice constant and a variable mismatch layer comprising a second semiconductor material disposed between the substrate and the first layer. The variable mismatch layer is configured to reduce stress in the first layer to below a level of stress resulting from growth of the first layer directly on the substrate.

In particular embodiments of the present invention, the variable mismatch layer Is a second layer disposed adjacent the substrate. In such embodiments, the second semiconductor material has a third in-plane uinstrained lattice constant that is mismatched with the first in-plane unstrained lattice constant. The second layer has an in-plane strained lattice constant that is substantially matched to the second in-plane unstrained lattice constant of the first layer.

In further embodiments of the present invention, the variable mismatch layer includes a third layer comprising a third semiconductor material disposed between the second layer and the first layer that transitions from the strained in-plane lattice constant of the second layer to the second in-plane unstrained lattice constant of the first layer. The third semiconductor material may be a graded semiconductor material that transitions from the second semiconductor material to the first semiconductor material. For example, the third layer may have a first surface adjacent the second layer that has a composition that is substantially the same as the second semiconductor material and a second surface adjacent the first layer that has a composition that is substantially the same as the first semiconductor material.

In particular embodiments of the present invention, the in-plane strained lattice constant and the second in-plane unstrained lattice constant differ by less than about 1%. In other embodiments, the in-plane strained lattice constant and the second in-plane unstrained lattice constant may also differ by less than about 0.5% In still other embodiments, the in-plane strained lattice constant and the second in-plane unstrained lattice constant may further differ by less than about 0.1%.

In still other embodiments of the present invention, the second layer has a thickness that is less than a thickness at which cracking occurs.

In additional embodiments of the present invention, the first semiconductor material and the second semiconductor material are nitride based semiconductor materials. A buffer layer may also be provided between the substrate and the variable mismatch layer.

In further embodiments of the present invention, a nitride based semiconductor structure for a semiconductor device is provided that includes a substrate having a first unstrained lattice constant and a first layer comprising a first nitride based semiconductor material on the substrate. The first nitride based semiconductor material has a second unstrained lattice constant different from the first unstralined lattice constant. The first layer has a first in-plane strained lattice constant. A second layer comprising a second nitride based semiconductor material is also provided on the first layer. The second nitride based semiconductor material has a third unstrained lattice constant that is substantially the same as the first in-plane strained lattice constant.

In still further embodiments of the present invention, a graded semiconductor layer is disposed between the first layer and the second layer that transitions from the first nitride based semiconductor material to the second nitride based semiconductor material. A buffer layer may also be provided between the substrate and the first layer.

In certain embodiments of the present invention, the first in-plane strained lattice constant and the third unstrained lattice constant differ by less than about 1%. In other embodiments, the first in-plane strained lattice constant and the third unstrained lattice constant differ by less than about 0.5%. In still further embodiments, the first in-plane strained lattice constant and the third unstrained lattice constant differ by less than about 0.1%. The first layer may also have a thickness that is less than a thickness at which cracking occurs.

In particular embodiments of the present invention, the first layer and the second layer comprise Group III-nitride semiconductor materials. The substrate may also be a silicon carbide substrate or a sapphire substrate. Furthermore, the first layer and the second layer may be GaN based semiconductor materials.

In certain embodiments of the present invention, the first layer is $Al_xGa_{1-x}N$, wherein $0 \leq x \leq 1$. Furthermore, the second layer may be $Al_yGa_{1-y}N$, wherein $0 \leq y \leq 1$. In other embodiments of the present invention, the first layer is $Al_xGa_{1-x}N$, where $0 < x \leq 1$, the second layer is $Al_yGa_{1-y}N$, where $0 \leq y < 1$ and the graded semiconductor layer is $Al_zGa_{1-z}N$, where z transitions from x to y.

In additional embodiments of the present invention, a semiconductor structure is fabricated by forming a variable mismatch layer comprising a second semiconductor material is formed on the substrate. A first layer comprising a first semiconductor material is formed on the variable mismatch layer. The substrate has a first in-plane unstrained lattice constant and the first layer has a second in-plane unstrained lattice constant that is different from the first in-plane unstrained lattice constant. The variable mismatch layer is configured to reduce stress in the first layer to below a level of stress resulting from growth of the first layer directly on the substrate.

In some embodiments of the present invention, the variable mismatch layer is formed by forming a second layer disposed adjacent the substrate. The second semiconductor material has a third in-plane unstrained lattice constant that is mismatched with the first in-plane unstrained lattice constant and the second layer is formed to have an in-plane strained lattice constant that is substantially matched to the second in-plane unstrained lattice constant of the first layer. The second layer may be formed by forming 3D islands of the second semiconductor material on the substrate and growing the second semiconductor material such that the second semiconductor material coalesces in regions between the 3D islands. In further embodiments, a buffer layer is formed on the substrate between the second layer and the substrate. In such embodiments, the 3D islands may be formed on the buffer layer.

In still further embodiments of the present invention, forming the variable mismatch layer further includes forming a third layer comprising a third semiconductor material disposed between the second layer and the first layer that transitions from the strained in-plane lattice constant of the second layer to the second in-plane unstrained lattice constant of the first layer. For example, the third layer may be formed by forming a graded layer of the third semiconductor material that transitions from the second semiconductor material to the first semiconductor material. The graded layer may be formed by forming the third layer such that the third layer has a first surface adjacent the second layer that has a composition that is substantially the same as the second semiconductor material and a second surface adjacent the first layer that has a composition that is substantially the same as the first semiconductor material.

In still further embodiments of the present invention, the variable mismatch layer is configured to provide a first layer that is strained at a growth temperature and substantially unstrained at a second temperature, different from the growth temperature. The second temperature may be room temperature. The second temperature could also be selected from the group consisting of a device operation temperature, a substrate removal temperature, and a bulk regrowth temperature. Furthermore, the second temperature may be an intermediate temperature between a highest and a lowest processing, storage and/or operating temperature.

In additional embodiments of the present invention, a nitride based semiconductor structure for a semiconductor device is fabricated by forming a first layer comprising a first nitride based semiconductor material on a substrate. The substrate has a first unstrained lattice constant and the first nitride based semiconductor material has a second unstrained lattice constant different from the first unstrained lattice constant. The first layer also has a first in-plane strained lattice constant. A second layer comprising a second nitride based semiconductor material is formed on the first layer. The second nitride based semiconductor material has a third unstrained lattice constant that is substantially the same as the first in-plane strained lattice constant.

In further embodiments of the present invention, the fabrication of the semiconductor structure includes forming a graded semiconductor layer disposed between the first layer and the second layer that transitions from the first nitride based semiconductor material to the second nitride based semiconductor material. The fabrication may also include forming a buffer layer between the substrate and the first layer.

In particular embodiments of the present invention, the first layer and the second layer comprise Group III-nitride semiconductor materials. Also, the substrate may be a silicon carbide substrate or a sapphire substrate. Furthermore, the first layer and the second layer may be GaN based semiconductor materials. For example, in certain embodiments of the present invention, the first layer may be $Al_xGa_{1-x}N$, wherein $0 \leq x \leq 1$, and the second layer may be $Al_yGa_{1-y}N$, wherein $0 \leq y \leq 1$. In still further embodiments of the present invention, the first layer is $Al_xGa_{1-x}N$, where $0 \leq x \leq 1$, the second layer is $Al_yGa_{1-y}N$, where $0 \leq y \leq 1$ and the graded semiconductor layer is $Al_zGa_{1-z}N$, where z transitions from x to y.

In other embodiments of the present invention, forming a first layer includes forming 3D islands of the first nitride based semiconductor material on the substrate and growing the first nitride based semiconductor material such that the second semiconductor material coalesces in regions between the 3D islands. In embodiments where the fabrication also includes forming a buffer layer on the substrate between the first layer and the substrate, the 3D islands may be formed on the buffer layer.

In still further embodiments of the present invention, forming a first layer includes forming a first layer of the first nitride based semiconductor material so as to be unstrained at a growth temperature and strained when cooled from growth temperature. In other embodiments, forming a first layer includes forming a first layer of the first nitride based semiconductor material so as to be strained at a growth temperature and strained when cooled from growth temperature. Additionally, the strain at growth temperature may compensate for strain induced in the first layer when cooled from growth temperature, for example, so that the first layer is unstrained when cooled from growth temperature.

DETAILED DESCRIPTION OF EMBODIMENTS OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer.

Embodiments of the present invention can provide a strain compensated semiconductor structure on which semiconductor devices may be fabricated. Additionally, embodiments of the present invention may provide a strain compensated semiconductor structure that may be utilized in providing substrates and/or seed crystals for producing semiconductor substrates. The strain compensated semiconductor structure includes a semiconductor layer or layers that act as a transition from an underlying layer to a layer on which semiconductor devices may be fabricated. The transition between the two layers (which may include a substrate) is provided by controlling the strain in the layer or layers between the underlying layer and the layer on which the semiconductor devices are fabricated such that the layer on which the semiconductor devices are fabricated has an unstrained lattice constant that substantially matches the strained in-plane lattice constant on which it is fabricated. Thus, embodiments of the present invention may provide means for reducing stress in the first layer to below a level of stress resulting from growth of the first layer directly on the substrate.

In some embodiments of the present invention, a substantial match of lattice constants is provided by lattice constants that are within 1% of each other while a substantial mismatch of lattice constants is provided by lattice constants that are not within 1% of each other. In other embodiments of the present invention, a substantial match of lattice constants is provided by lattice constants that are within 0.5% of each other while a substantial mismatch of lattice constants is provided by lattice constants that are not within 0.5% of each other. In still further embodiments of the present invention, a substantial match of lattice constants is provided by lattice constants that are within 0.1% of each other while a substantial mismatch of lattice constants is provided by lattice constants that are not within 0.1% of each other.

Embodiments of the present invention are described below with reference to a Group III nitride based semiconductor structure. However, as will be appreciated by those of skill in the art in light of the present disclosure, embodiments of the present invention may be advantageously utilized with other semiconductor materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quatemary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Figure 1:
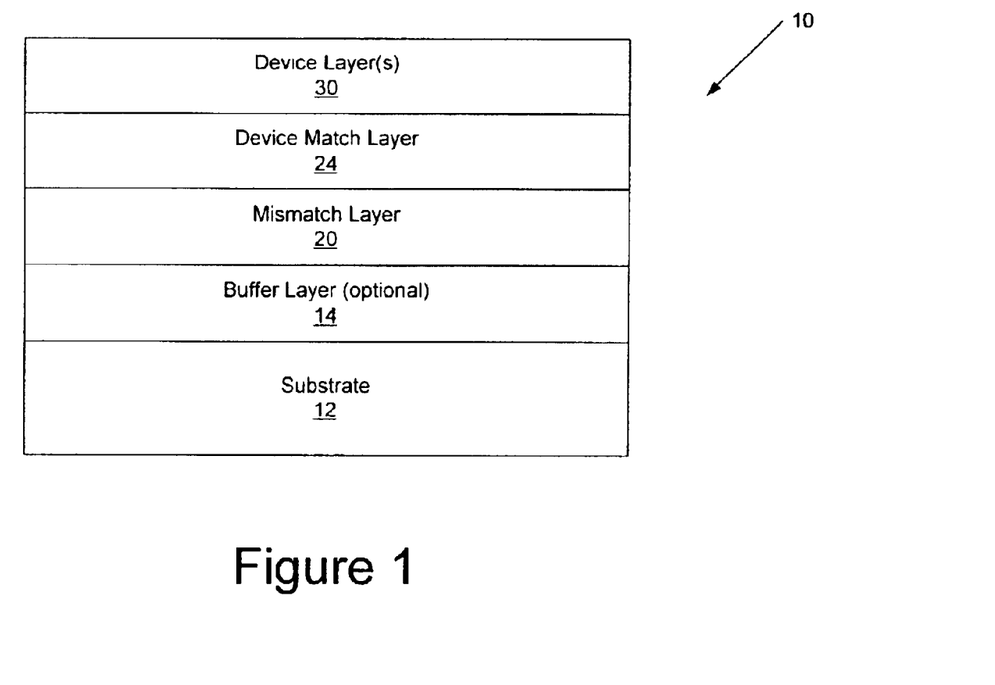
FIG. 1 is a side cross-sectional view of a semiconductor structure according to embodiments of the present invention.

Some embodiments of the present invention are schematically illustrated in the cross-sectional view of FIG. 1. The semiconductor structure 10 in certain embodiments of the present invention includes a silicon carbide (SiC) substrate 12 that may be, for example, 4H polytype of silicon carbide. Other silicon carbide candidate polytypes include the 3C, 6H, and 15R polytypes. In some embodiments the substrate 12 is semi-insulating. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

An optional buffer layer 14, such as an aluminum nitride buffer layer, is on the substrate 12 and provides a transition of crystal structure between the silicon carbide substrate and the remainder of the device. Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although embodiments of the present invention are described herein with reference to a silicon carbide substrate, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed. In some embodiments, the buffer layer 14 may comprise a plurality of sublayers.

SiC substrates suitable for use in embodiments of the present invention are manufactured by, for example, Cree, Inc., of Durham, N.C., the assignee of the present invention, and methods for producing SiC substrates are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

In additional embodiments of the present invention, the substrate may be a GaN based substrate, for example, produced utilizing a epitaxial lateral overgrowth (ELOG) or a pendeo-epitaxial growth technique. Examples of such techniques are described in U.S. Pat. No. 6,051,849 entitled "GALLIUM NITRIDE SEMICONDUCTOR STRUCTURES INCLUDING A LATERAL GALLIUM NITRIDE LAYER THAT EXTENDS FROM AN UNDERLYING GALLIUM NITRIDE LAYER," U.S. patent application Ser. No. 09/525,721, entitled "GALLIUM NITRIDE SEMICONDUCTOR STRUCTURES INCLUDING LATERALLY OFFSET PATTERNED LAYERS" filed Feb. 27, 1988, U.S. Pat. No. 6,265,289 entitled "METHODS OF FABRICATING GALLIUM NITRIDE SEMICONDUCTOR LAYERS BY LATERAL GROWTH FROM SIDEWALLS INTO TRENCHES, AND GALLIUM NITRIDE SEMICONDUCTOR STRUCTURES FABRICATED THEREBY" and U.S. Pat. No. 6,177,688 entitled "PENDEOEPITAXIAL GALLIUM NITRIDE SEMICONDUCTOR LAYERS ON SILICON CARBIDE SUBSTRATES", the disclosures of which are incorporated herein as if set forth in their entirety. Additionally, embodiments of the present invention may be utilized prior to such growth techniques so as to provide a gallium nitride based layer on which subsequent gallium nitride based layers are provided.

Returning to FIG. 1, the semiconductor structure 10 includes a mismatch layer 20 on the substrate 12 or buffer layer 14. A device match layer 24 may be provided on the mismatch layer 20 and device layers 30 may be formed on the device match layer 24. The mismatch layer 20 has an unstrained lattice constant that is mismatched with the unstrained lattice constant of the substrate 12 and/or buffer layer 14. The mismatch layer 20 has an in-plane strained lattice constant that is substantially lattice matched with the unstrained lattice constant of the device match layer 24. The device match layer may act as a quasi-ideal substrate layer that is substantially unstrained and substantially lattice matched to the device layers 30. It will be understood that in some embodiments, the mismatch layer 20, the device match layer 24 and/or the device layer 30 may include a plurality of sublayers.

The semiconductor material of the mismatch layer 20 has structural properties (e.g. similar crystal structure and orientation) similar to the semiconductor material(s) of the device layers 30 and/or the device match layer 24 but has an unstrained lattice constant that is sufficiently mismatched with a lattice constant of the substrate 12 and/or buffer layer 14 such that it does not have the lattice constant of the substrate 12 but is still under strain. For example, the mismatch layer 20 may be a layer formed by initial 3D island growth that leaves tensile strain upon coalescence even in the presence of lattice mismatch relaxation, for example, through dislocation formation. In certain embodiments of the present invention, the mismatch layer 20 may be grown on a SiC substrate as a substantially unstrained layer at a growth temperature and strain induced in the mismatch layer 20 when the structure cools from the growth temperature. In other embodiments, the mismatch layer 20 may be grown on a SiC substrate having a strain at a growth temperature that compensates for strain induced in the mismatch layer 20 when the structure cools from the growth temperature to provide the desired in-plane strained lattice constant.

Furthermore, the device match layer 24 may be grown, for example, by adjusting the composition, such as the Al composition, or growth conditions of the mismatch layer 20, such that the device match layer 24 is under compressive strain at growth temperature if the thermal expansion coefficient ("TEC") of the device match layer 24 is greater than that of the substrate (e.g. GaN/SiC) or under tensile strain at the growth temperature if the TEC of the device match layer 24 is less than that of the substrate (e.g. GaN/Al$_2$O$_3$) such that the device match layer 24 is more nearly relaxed at room temperature. The temperature at which the device match layer 24 is substantially unstrained may, instead, be chosen to be the substrate removal temperature to facilitate removal in a single piece. Alternatively, the temperature at which the device match layer 24 is substantially unstrained could be chosen to be the bulk regrowth temperature for the case of using the device match layer 24 as a seed still attached to the original substrate. Furthermore, the temperature at which the device match layer 24 is substantially unstrained could be chosen based on the device operating temperature. The temperature at which the device match layer 24 is substantially unstrained could also be chosen based on an intermediate temperature such that strain never exceeds a critical value over all temperature ranges the structure will experience over its lifetime.

In some embodiments of the present invention, the mismatch layer 20 may comprise a Group III-nitride, such as AlGaN or AlInGaN. However, in other embodiments of the present invention, the mismatch layer 20 may also be other semiconductor materials, such as SiGe, GaAs or the like. In certain embodiments of the present invention, the mismatch layer 20 may be substantially free of dopants, such as Si and Mg. The thickness of the mismatch layer 20 may vary depending on the particular semiconductor structure. For example, the thickness of the mismatch layer 20 may be from about 1 nm to about 1 µm for an AlGaN based mismatch layer. The mismatch layer 20 should not be so thick as to cause cracking and/or substantial defect formation therein. The mismatch layer 20 may be semi-insulating. In certain embodiments, the mismatch layer 20 is AlGaN with a substantially uniform aluminum concentration. In further embodiments, the mismatch layer 20 may be an Al$_x$Ga$_{1-x}$N layer that is graded with composition x decreasing during the growth. The change in composition may be linear, non-linear and/or step wise. Furthermore, the mismatch layer 20 may be a short period super lattice of AlN and GaN or AlGaN and AlGaN.

In addition to the optional buffer layer 14, the mismatch layer 20 may be formed on or above one or more optional intervening layers (not shown). If such is the case, the strain energy that such intervening layers impart to the mismatch layer 20 may be taken into account so as to provide the appropriate strained in-plane lattice constant of the mismatch layer 20.

The particular composition, growth conditions and the like, of the mismatch layer 20 may be selected so as to provide the desired strained in-plane lattice constant. As briefly discussed above, in certain embodiments of the present invention, the mismatch layer 20 may be fabricated by forming three dimensional islands on the substrate 12 or the buffer layer 14 and growing the mismatch layer 20 such that the semiconductor material, such as an AlGaN based material, coalesces between the islands. Such growth can provide a mismatch layer 20 that does not take on the lattice constant of the underlying substrate but remains strained such that the in-plane unstrained lattice constant of the semiconductor material of the mismatch layer 20 differs from the strained in-plane lattice constant of the mismatch layer 20.

For example, in certain embodiments of the present invention a semi-insulating AlN layer is deposited at high temperature (e.g. >1000 C.) on a semi-insulating SiC substrate as a nucleation/buffer layer. Next, a semi-insulating Al$_x$Ga$_{1-x}$N layer (x~0.2) is deposited at high temperature (e.g. >1000 C.) on the AlN layer to provide a mismatch layer 20. The growth conditions (such as temperature, pressure, V/III ratio, growth rate, thickness, etc.) are adjusted to ensure that the AlGaN is not coherently strained to the AlN layer. Preferably, the AlGaN will initially begin growth in a three-dimensional mode with a relatively low density of nuclei (e.g. <10$^9$ cm$^{-2}$). As would be appreciated by those of skill in the art in light of the present disclosure, the detailed growth conditions may differ depending on reactor geometry and, therefore, may be adjusted accordingly to achieve AlGaN with the desired properties. A device match layer 24 of Al$_x$Ga$_{1-x}$N (x~0.1) may be provided on the mismatch layer 20. X-ray diffraction crystallography may be used to determine the strained lattice constant of the resulting AlGaN layer. If the resulting AlGaN layer does not have the desired strained in-plane lattice constant, the composition of the AlGaN layer and/or the growth conditions may be adjusted so as to provide the desired strained in-plane lattice constant.

Because the device match layer 24 is substantially unstrained, a thick layer may be grown that may allow for dislocation annihilation. For example, in certain embodiments of the present invention, the device match layer 24 may be grown to a thickness of from about 0.1 µm to about 1 mm or thicker. In particular embodiments of the present invention where the device match layer 24 comprises a GaN based layer, the device match layer 24 may be grown to a thickness of from about 0.1 µm to about 1 mm or thicker without cracking. Through utilization of embodiments of the present invention, high quality semiconductor regions may be provided that are substantially lattice matched to a device's semiconductor material. Such semiconductor regions may be substantially unstrained which may reduce the likelihood of cracking through growth of subsequent semiconductor layers. Thus, embodiments of the present invention may be useful in producing diodes, laser diodes, transistors, high electron mobility transistors, or other such semiconductor devices.

Figure 2:
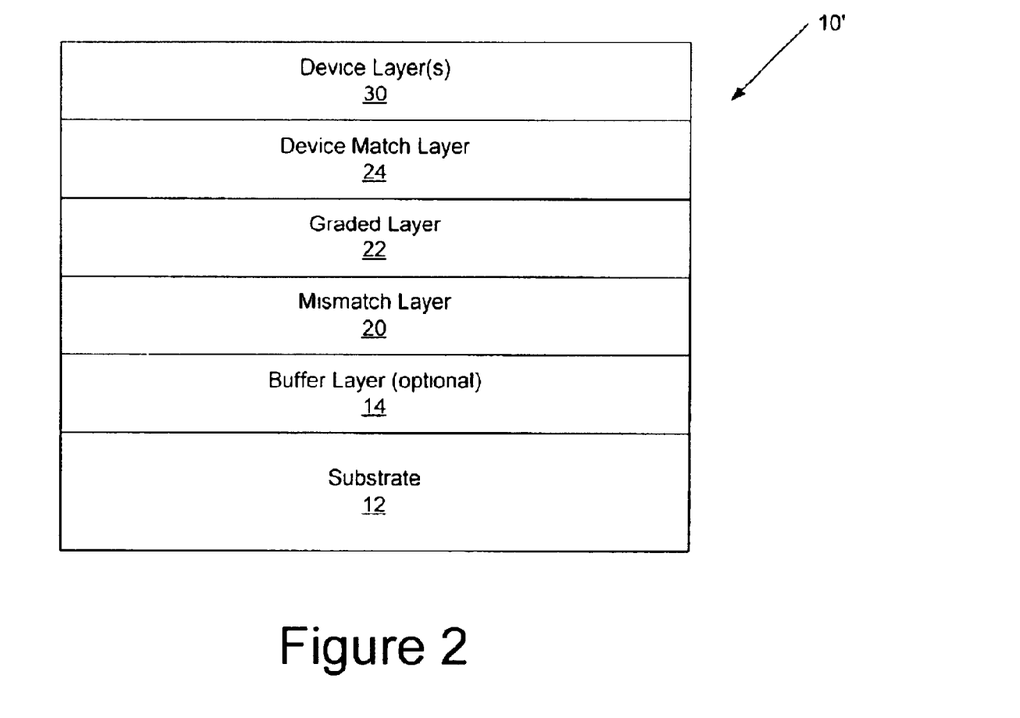
FIG. 2 is a side cross-sectional view of a semiconductor structure according to further embodiments of the present invention.

FIG. 2 illustrates further embodiments of the present invention. As seen in FIG. 2, the semiconductor structure 10' includes a graded transition layer 22. The graded transition layer may transition from the strained in-plane lattice constant of the mismatch layer 20 to the unstrained lattice constant of the device match layer 24. The graded transition layer 22 may include one or more sublayers and may be graded in a linear, non-linear and/or step wise manner. Thus, over the thickness of the graded transition layer 22 the strained in-plane lattice constant may remain substantially the same but the strain in the layer is reduced. Thus, the likelihood of the total strain of the structure exceeding a threshold at which cracking occurs may be reduced.

In certain embodiments of the present invention, the graded transition layer 22 is an $Al_xGa_{1-x}N$ layer where x changes from the mismatch layer 20 to the device match layer 24. In certain embodiments, x is 0 at the interface between the graded transition layer 22 and the device match layer 24 such that the graded transition layer 22 transitions from AlGaN to GaN. For example, in the embodiment described above, a graded transition layer 22 may be provided between the mismatch layer 20 and the device match layer 24 that transitions from $Al_xGa_{1-x}N$ where x~0.2 to $Al_xGa_{1-x}N$ where x~0.1. However, in other embodiments of the present invention, the graded transition layer 22 may be other graded semiconductor materials such that the graded transition layer 22 changes in composition from a semiconductor material that is substantially the same as the semiconductor material of the mismatch layer 20 to a semiconductor material that is substantially the same as the semiconductor material of the device match layer 24.

As described above, the specific composition of the various layers of the structure may vary depending on the desired composition and/or strain of the device match layer 24. Furthermore, the composition of various layers may depend on the unintentional stress in the mismatch layer 20. Thus, for example, if the unintentional stress is ~0.8 GPa tensile in the mismatch layer 20, a value of x=10% for $Al_xGa_{1-x}N$ in the mismatch layer 20 for GaN device layers may be suitable.

In further embodiments of the present invention, the substrate 12 may be removed from a thick device match layer 24 that becomes low stress. Such embodiments may, for example, be suitable for use as seed crystals in growing additional semiconductor structures. These low stress layers could be used as seed crystals for growth of thicker bulk crystal boules, which could in turn be sliced into wafers and used as substrates for growth of devices. For example, such semiconductor structures may be utilized to provide a GaN layer for fabrication utilizing ELOG and/or pendeo-epitaxial fabrication techniques.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A method of fabricating a semiconductor structure, comprising:

forming a variable mismatch layer comprising a first semiconductor material on a substrate, the substrate having a first in-plane unstrained lattice constant;

forming a first layer comprising a first semiconductor material on the variable mismatch layer, the first layer having a second in-plane unstrained lattice constant that is different from the first in-plane unstrained lattice constant; and wherein the variable mismatch layer is configured to reduce stress in the first layer to below a level of stress resulting from growth of the first layer directly on the substrate; and wherein the step of forming a variable mismatch layer comprises forming a second layer disposed adjacent the substrate, where the second semiconductor material has a third in-plane unstrained lattice constant that is mismatched with the first in-plane unstrained lattice constant and the second layer is formed to have an in-plane strained lattice constant that differs from the second in-plane unstrained lattice constant of the first layer by less than about 1%.

2. A method of fabricating a semiconductor structure, comprising:

forming a variable mismatch layer comprising a first semiconductor material on a substrate, the substrate having a first in-plane unstrained lattice constant;

forming a first layer comprising a second semiconductor material on the variable mismatch layer, the first layer having a second in-plane unstrained lattice constant that is different from the first in-plane unstrained lattice constant;

wherein the variable mismatch layer is configured to reduce stress in the first layer to below a level of stress resulting from growth of the first layer directly on the substrate;

wherein the step of forming a variable mismatch layer comprises forming a second layer disposed adjacent the substrate, where the second semiconductor material has a third in-plane unstrained lattice constant that is mismatched with the first in-plane unstrained lattice constant and the second layer is formed to have an in-plane strained lattice constant that is substantially matched to the second in-plane unstrained lattice constant of the first layer;

wherein the step of forming a second layer comprises the steps of:

forming 3D islands of the second semiconductor material on the substrate; and growing the second semiconductor material such that the second semiconductor material coalesces in regions between the 3D islands.

3. The method of claim 2, further comprising the step of forming a buffer layer on the substrate between the second layer and the substrate; and wherein the step of forming 3D islands comprises forming 3D islands on the buffer layer.

4. The method of claim 1, wherein the step of forming a variable mismatch layer further comprises the step of forming a third layer comprising a third semiconductor material disposed between the second layer and the first layer that transitions from the strained in-plane lattice constant of the second layer to the second in-plane unstrained lattice constant of the first layer.

5. The method of claim 4, wherein the step of forming a third layer comprises the step of forming a graded layer of the third semiconductor material that transitions from the second semiconductor material to the first semiconductor material.

6. The method of claim 5, wherein the step of forming a graded layer comprises forming the third layer such that the third layer has a first surface adjacent the second layer that has a composition that is substantially the same as the second semiconductor material and a second surface adjacent the first layer that has a composition that is substantially the same as the first semiconductor material.

7. The method of claim 1, wherein the step of forming a second layer comprises forming a second layer such that the in-plane strained lattice constant and the second in-plane unstrained lattice constant differ by less than about 0.5%.

8. The method of claim 1, wherein the step of forming a second layer comprises forming a second layer such that the in-plane strained lattice constant and the second in-plane unstrained lattice constant differ by less than about 0.1%.

9. The method of claim 1, wherein the step of forming a second layer comprises forming a second layer such that the second layer has a thickness that is less than a thickness at which cracking occurs.

10. The method of claim 1, wherein the first semiconductor material and the second semiconductor material are nitride based semiconductor materials.

11. The method of claim 1, further comprising the step of forming a buffer layer between the substrate and the variable mismatch layer.

12. The method of claim 1, further comprising the step of utilizing the first layer as a seed crystal in forming a layer of semiconductor material.

13. The method of claim 12, further comprising the step of removing the substrate from the first layer.

14. The method of claim 1, wherein the step of forming a variable mismatch layer comprises forming a variable mismatch layer configured to provide a first layer that is strained at a growth temperature and substantially unstrained at a second temperature, different from the growth temperature.

15. The method of claim 14, wherein the second temperature is room temperature.

16. The method of claim 14, wherein the second temperature is selected from the group consisting of a device operation temperature, a substrate removal temperature and a bulk regrowth temperature.

17. The method of claim 14, wherein the second temperature is an intermediate temperature between a highest and a lowest processing, storage and/or operating temperature.

18. A method of fabricating a nitride based semiconductor structure for a semiconductor device, comprising:
forming a first layer comprising a first nitride based semiconductor material on the substrate, the substrate having a first unstrained lattice constant and the first nitride based semiconductor material having a second unstrained lattice constant different from the first unstrained lattice constant and the first layer having a first in-plane strained lattice constant; and
forming a second layer comprising a second nitride based semiconductor material on the first layer, the second nitride based semiconductor material having a third unstrained lattice constant that differs from the first in-plane strained lattice constant by less than about 1%.

19. The method of claim 18, further comprising forming a graded semiconductor layer disposed between the first layer and the second layer that transitions from the first nitride based semiconductor material to the second nitride based semiconductor material.

20. The method of claim 18, further comprising forming a buffer layer between the substrate and the first layer.

21. The method of claim 18, wherein the step of forming a first layer comprises forming a first layer such that the first in-plane strained lattice constant and the third unstrained lattice constant differ by less than about 0.5%.

22. The method of claim 18, wherein the step of forming a first layer comprises forming a first layer such that the first in-plane strained lattice constant and the third unstrained lattice constant differ by less than about 0.1%.

23. The method of claim 18, wherein the step of forming a first layer comprises forming a first layer such that the first layer has a thickness that is less than a thickness at which cracking occurs.

24. The method of claim 18, wherein the first layer and the second layer comprise Group III-nitride semiconductor materials.

25. The method of claim 24, wherein the substrate comprises a silicon carbide substrate or a sapphire substrate.

26. The method of claim 19, wherein the first layer and the second layer comprise GaN based semiconductor materials.

27. The method of claim 26, wherein the first layer comprises $Al_xGa_{1-x}N$, wherein $0 \leq x \leq 1$.

28. The method of claim 27, wherein the second layer comprises $Al_yGa_{1-y}N$, wherein $0 \leq y \leq 1$.

29. The method of claim 19, wherein the first layer comprises $Al_xGa_{1-x}N$, where $0 \leq x \leq 1$, the second layer comprises $Al_yGa_{1-y}N$, where $0 \leq y \leq 1$ and the graded semiconductor layer comprises $Al_zGa_{1-z}N$, where x is not equal to y and z transitions from x to y.

30. A method of fabricating a nitride based semiconductor structure for a semiconductor device, comprising:
forming a first layer comprising a first nitride based semiconductor material on the substrate, the substrate having a first unstrained lattice constant and the first nitride based semiconductor material having a second unstrained lattice constant different from the first unstrained lattice constant and the first layer having a first in-plane strained lattice constant;
forming a second layer comprising a second nitride based semiconductor material on the first layer, the second nitride based semiconductor material having a third unstrained lattice constant that is substantially the same as the first in-plane strained lattice constant;
wherein the step of forming a first layer comprises the steps of:
forming 3D islands of the first nitride based semiconductor material on the substrate; and
growing the first nitride based semiconductor material such that the second semiconductor material coalesces in regions between the 3D islands.

31. The method of claim 30, further comprising the step of forming a buffer layer on the substrate between the first layer and the substrate; and
wherein the step of forming 3D islands comprises forming 3D islands on the buffer layer.

32. The method of claim 18, wherein the step of forming a first layer comprises forming a first layer of the first nitride based semiconductor material so as to be unstrained at a growth temperature and strained when cooled from growth temperature.

33. The method of claim 18, wherein the step of forming a first layer comprises forming a first layer of the first nitride based semiconductor material so as to be strained at a growth temperature and strained when cooled from growth temperature.

34. The method of claim 33, wherein the amount of strain at growth temperature compensates for the amount of strain induced in the first layer when cooled from growth temperature.

35. The method of claim 18, further comprising the step of utilizing the second layer as a seed crystal in forming a layer of semiconductor material.

36. The method of claim 35, further comprising the step of removing the substrate from the first layer.

37. The method of claim 18, wherein the step of forming a first layer comprises forming a first layer configured to provide a second layer that is strained at a growth temperature and substantially unstrained at a second temperature, different from the growth temperature.

38. The method of claim 37, wherein the second temperature is room temperature.

39. The method of claims 37, wherein the second temperature is selected from the group consisting of a device operation temperature, a substrate removal temperature and a bulk regrowth temperature.

40. The method of claim 37, wherein the second temperature is an intermediate temperature between a highest and a lowest processing, storage and/or operating temperature.

* * * * *